US012060509B2

(12) United States Patent
Miyai et al.

(10) Patent No.: US 12,060,509 B2
(45) Date of Patent: Aug. 13, 2024

(54) CHLOROSILICATE FLUORESCENT MATERIAL, METHOD FOR PRODUCING THE SAME, AND LIGHT EMITTING DEVICE

(71) Applicant: NICHIA CORPORATION, Anan (JP)

(72) Inventors: Ryuta Miyai, Komatsushima (JP); Kazuya Nishimata, Anan (JP); Shoji Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/341,365

(22) Filed: Jun. 26, 2023

(65) Prior Publication Data

US 2023/0332043 A1    Oct. 19, 2023

Related U.S. Application Data

(63) Continuation of application No. 16/661,063, filed on Oct. 23, 2019, now Pat. No. 11,732,187.

(30) Foreign Application Priority Data

Oct. 25, 2018  (JP) .................................. 2018-201013
Oct. 15, 2019  (JP) .................................. 2019-188728

(51) Int. Cl.
*C09K 11/61*        (2006.01)
*C09K 11/77*        (2006.01)
*H01L 33/26*        (2010.01)

(52) U.S. Cl.
CPC ............ *C09K 11/617* (2013.01); *H01L 33/26* (2013.01)

(58) Field of Classification Search
CPC .................................................. C09K 11/617
See application file for complete search history.

(56) References Cited

U.S. PATENT DOCUMENTS 7,608,202 B2    10/2009  Murazaki
2004/0166320 A1*  8/2004  Kobusch .......... C09K 11/77342
                                                   428/404

(Continued)

FOREIGN PATENT DOCUMENTS

JP    2006219636 A    8/2006
JP    2006332134 A   12/2006

(Continued)

OTHER PUBLICATIONS

Xiao. Elemental Impurities in Pediatric Calcium Carbonate Preparations-High Throughput Quantification and Risk Assessment. Frontiers in Chemistry May 2021 vol. 9. (Year: 2021).

(Continued)

*Primary Examiner* — Matthew E. Hoban
(74) *Attorney, Agent, or Firm* — Hunton Andrews Kurth LLP (57) ABSTRACT

Provided are a chlorosilicate fluorescent material having high light emission efficiency, a method for producing the same, and a light emitting device. In certain embodiments, the chlorosilicate fluorescent material has a chemical composition comprising Ca, Eu, Mg, Si, O, and Cl, wherein when a molar ratio of Si in 1 mol of the chemical composition is set as 4, the chlorosilicate fluorescent material comprises Ca in a molar ratio range of 7.0 or more and 7.94 or less, Eu in a molar ratio range of 0.01 or more and 1.0 or less, Ca and Eu in a total molar ratio range of 7.70 or more and 7.95 or less, Mg in a molar ratio range of 0.9 or more and 1.1 or less, and Cl in a molar ratio range of more than 1.90 and 2.00 or less.

6 Claims, 3 Drawing Sheets

(56) References Cited

U.S. PATENT DOCUMENTS

| | | |
|---|---|---|
| 2006/0027785 A1 | 2/2006 | Wang et al. |
| 2006/0226759 A1 | 10/2006 | Masuda et al. |
| 2007/0200095 A1 | 8/2007 | Murazaki |
| 2010/0301738 A1 | 12/2010 | Hosokawa et al. |
| 2017/0130125 A1 | 5/2017 | Shibamoto et al. |
| 2017/0275531 A1* | 9/2017 | Yanagihara ...... C09K 11/77342 |
| 2020/0131437 A1 | 4/2020 | Miyai et al. |

FOREIGN PATENT DOCUMENTS

| | | |
|---|---|---|
| JP | 2007231250 A | 9/2007 |
| JP | 2008285576 A | 11/2008 |
| JP | 2010195948 A | 9/2010 |
| JP | 2010254851 A | 11/2010 |
| JP | 2017179339 A | 10/2017 |
| JP | 2017222750 A | 12/2017 |
| WO | 2016002185 A1 | 1/2016 |

OTHER PUBLICATIONS

United States Patent and Trademark Office, Non-Final Office Action issued to U.S. Appl. No. 16/661,063 on Jun. 16, 2021.
United States Patent and Trademark Office, Final Office Action issued to U.S. Appl. No. 16/661,063 on Dec. 10, 2021.
United States Patent and Trademark Office, Non-Final Office Action issued to U.S. Appl. No. 16/661,063 on Mar. 8, 2022.
United States Patent and Trademark Office, Final Office Action issued to U.S. Appl. No. 16/661,063 on Sep. 14, 2022.
United States Patent and Trademark Office, Advisory Action issued to U.S. Appl. No. 16/661,063 on Nov. 29, 2022.
United States Patent and Trademark Office, Non-Final Office Action issued to U.S. Appl. No. 16/661,063 on Dec. 20, 2022.
United States Patent and Trademark Office, Notice of Allowance issued to U.S. Appl. No. 16/661,063 on Mar. 31, 2023.

* cited by examiner

CHLOROSILICATE FLUORESCENT MATERIAL, METHOD FOR PRODUCING THE SAME, AND LIGHT EMITTING DEVICE

CROSS-REFERENCE TO RELATED PATENT APPLICATION

This is a continuation application of U.S. patent application Ser. No. 16/661,063, filed Oct. 23, 2019, which claims priority to Japanese Patent Application No. 2018-201013, filed on Oct. 25, 2018, and Japanese Patent Application No. 2019-188728, filed on Oct. 15, 2019, the entire disclosures of which are incorporated herein by reference in their entireties.

BACKGROUND

Technical Field

The present disclosure relates to a chlorosilicate fluorescent material, a method for producing the same, and a light emitting device. In this specification, the "fluorescent material" is used in the same meaning as a "fluorescent phosphor".

Description of Related Art

A light emitting device that can emit light of various color phases according to the principle of light mixing has been developed by combining a light source with a wavelength conversion member capable of emitting light of a color phase different from the color phase of the light source as excited with the light emitted from the light source. For example, in a light emitting device including a light emitting element such as a light emitting diode (hereinafter referred to as "LED") in combination with fluorescent materials serving as wavelength converting members, each fluorescent material that emits red, green, and blue light is excited with light at a short wavelength side corresponding to visible light from ultraviolet light emitted from the light emitting element, and the light in red, green, and blue, which are three primary colors of light, can be mixed to obtain white light.

As a fluorescent material that emits light in yellow to green, for example, US patent application publication No. 2006/0027785 discloses an Eu-activated silicate fluorescent material.

Examples of the typical fluorescent material that emits green light among the silicate fluorescent materials may include Eu-activated calcium-magnesium chlorosilicate (the compositional formula is generally represented by $Ca_8Mg(SiO_4)_4Cl_2$) (hereinafter referred to as "chlorosilicate fluorescent material"). The green fluorescent material has a large influence on the luminous flux of the light emitting device, and in order to enhance the luminous flux of the light emitting device, a chlorosilicate fluorescent material having higher light emission efficiency is being demanded.

Thus, the present disclosure has an object to provide a fluorescent material having high light emission efficiency, a method for producing the same, and a light emitting device.

SUMMARY

The present disclosure includes the following embodiments.

A first embodiment of the present disclosure is a chlorosilicate fluorescent material having a chemical composition containing Ca, Eu, Mg, Si, O, and Cl, wherein when a molar ratio of Si in 1 mol of the chemical composition is set as 4, the chlorosilicate fluorescent material comprises Ca in a molar ratio range of 7.0 or more and 7.94 or less, Eu in a molar ratio range of 0.01 or more and 1.0 or less, Ca and Eu in a total molar ratio range of 7.70 or more and 7.95 or less, Mg in a molar ratio range of 0.9 or more and 1.1 or less, and Cl in a molar ratio range of more than 1.90 and 2.00 or less.

A second embodiment of the present disclosure is a light emitting device containing: a light source having a light emission peak wavelength in a range of 250 nm or more and 485 nm or less; and the chlorosilicate fluorescent material.

A third embodiment of the present disclosure is a method for producing a fluorescent material including: providing a compound containing Ca, a compound containing Eu, a compound containing Mg, a compound containing Si, and a compound containing Cl such that a molar ratio of Ca is in a range of 7 or more and 8.2 or less, a molar ratio of Eu is in a range of 0.01 or more and 1.1 or less, a molar ratio of Mg is in a range of 0.9 or more and 1.1 or less, a total molar ratio of Ca and Eu is in a range of 8.05 or more and 8.25 or less, and a molar ratio of Cl is in a range of 2.0 or more and 3.0 or less when a molar ratio of Si in the compound containing Si is set as 4; mixing the compound containing Ca, the compound containing Eu, the compound containing Mg, the compound containing Si, and the compound containing Cl to obtain a raw material mixture; and calcining the raw material mixture to obtain a chlorosilicate fluorescent material, wherein at least one of the compound containing Eu, the compound containing Mg, and the compound containing Si is an oxide, and the compound containing Cl optionally contains Ca or Mg.

In accordance with the above embodiments, a chlorosilicate fluorescent material having high light emission efficiency, a method for producing the same, and a light emitting device, can be provided.

DETAILED DESCRIPTION

The chlorosilicate fluorescent material, the production method, and the light emitting device according to the present disclosure will be hereunder described on the basis of embodiments. The embodiments described below are exemplifications for embodying the technical idea of the present disclosure, and the present disclosure is not limited to the following fluorescent material, production method, and light emitting device. Standards according to Japanese Industrial Standard (JIS) Z8110 are applied to the relations between color names and chromaticity coordinates, the relations between wavelength ranges of light and color names of monochromatic lights.

Fluorescent Material

The fluorescent material is a chlorosilicate fluorescent material having a chemical composition containing Ca, Eu, Mg, Si, O, and Cl, wherein when a molar ratio of Si in 1 mol of the chemical composition is set as 4, the chlorosilicate fluorescent material comprises Ca in a molar ratio range of 7.0 or more and 7.94 or less, Eu in a molar ratio range of 0.01 or more and 1.0 or less, Ca and Eu in a total molar ratio range of 7.70 or more and 7.95 or less, Mg in a molar ratio range of 0.9 or more and 1.1 or less, and Cl in a molar ratio range of more than 1.90 and 2.00 or less.

The fluorescent material is preferably a chlorosilicate fluorescent material having a chemical composition represented by the following formula (I).

$$Ca_xEu_yMg_zSi_4O_aCl_b \quad (I)$$

wherein a, b, x, y, and z each satisfy $7.0 \le x \le 7.94$, $0.01 \le y \le 1.0$, $7.70 \le x+y \le 7.95$, $0.9 \le z \le 1.1$, $15.6 \le a \le 16.1$, and $1.90 < b \le 2.00$.

In the formula (I), the parameters a, b, x, y, and z represent molar ratios of an O element, a Cl element, a Ca element, an Eu element, and a Mg element each constituting the chlorosilicate fluorescent material, respectively. The term "molar ratio" represents a molar amount of each element in 1 mol of the chemical composition of the fluorescent material.

The chlorosilicate is represented by $Ca_8Mg(SiO_4)_4Cl_2$ as a theoretical composition. In the chlorosilicate fluorescent material having a chemical composition containing Ca, Eu, Mg, Si, O, and Cl, Eu is an activating element, and it is considered that Eu is replaced with a part of the Ca site in the host crystal constituting the fluorescent material. It has been presumed that, in the composition of the chlorosilicate fluorescent material, the total molar ratio of Ca and Eu is preferably a value close to 8, which is the molar ratio of Ca in 1 mol of the theoretical composition of the chlorosilicate, from the viewpoint of stability of the crystal structure. However, the present inventors find out that when the total molar ratio of Ca and Eu in the chlorosilicate fluorescent material is 8, which is the molar ratio of Ca in 1 mol of the theoretical composition, or a value more than 8, a dual phase of the calcium silicate is readily generated by binding Ca to the silicate, and the light emission efficiency may be rather decreased. When the maximum value of the total molar ratio of Ca and Eu in 1 mol of the chemical composition of the chlorosilicate fluorescent material is 7.95 or less, which is less than 8 that is the molar ratio of Ca in 1 mol of the theoretical composition of the chlorosilicate, the generation of the dual phase of the calcium silicate is suppressed, and the light emission efficiency can be increased. The chlorosilicate fluorescent material contains Ca and Eu in a total molar ratio range of 7.70 or more and 7.95 or less, preferably in a total molar ratio range of 7.80 or more and 7.95 or less when a molar ratio of Si in 1 mol of the chemical composition is set as 4. In the chlorosilicate fluorescent material having a chemical composition represented by the formula (I), the total value of the parameter x representing a molar ratio of Ca and the parameter y representing a molar ratio of Eu is in a range of 7.70 or more and 7.95 or less ($7.70 \le x+y \le 7.95$), and preferably in a range of 7.80 or more and 7.95 or less ($7.80 \le x+y \le 7.95$). When the total molar ratio of Ca and Eu in 1 mol of the chemical composition of the chlorosilicate fluorescent material is 7.70 or more, a stable crystal structure can be maintained, and the light emission efficiency can be enhanced.

The chlorosilicate fluorescent material contains Cl, which constitutes the host crystal, in a molar ratio range of more than 1.90 and 2.00 or less. When the molar ratio of Cl in the theoretical composition of the chlorosilicate is smaller than 1.90, defects may occur in the host crystal, and the light emission efficiency may be lowered. When the chlorosilicate fluorescent material contains Cl, which constitutes the host crystal, in a molar ratio of more than 2.00, defects may occur in the host crystal, and the light emission efficiency may be lowered. For stability of the crystal structure, the chlorosilicate fluorescent material contains Cl, which constitutes the host crystal, in a molar ratio range of more than 1.90 and 2.00 or less, preferably in a molar ratio range of 1.95 or more and less than 2.00. In the chlorosilicate fluorescent material having a chemical composition represented by the formula (I), the parameter b representing a molar ratio of Cl, which constitutes the host crystal, is in a range of more than 1.90 and 2.00 or less ($1.90 < b \le 2.00$), and preferably in a range of 1.95 or more and less than 2.00 ($1.95 \le b < 2.00$).

In order to enhance the light emission efficiency, the chlorosilicate fluorescent material contains Ca in 1 mol of the chemical composition in a molar ratio range of 7.00 or more and 7.94 or less, and preferably in a molar ratio range of 7.20 or more and 7.90 or less, more preferably in a molar ratio range of 7.30 or more and 7.80 or less, even more preferably in a molar ratio range of 7.40 or more and 7.70 or less. In the fluorescent material having a chemical composition represented by the formula (I), the parameter x representing a molar ratio of Ca is in a range of 7.00 or more and 7.94 or less ($7.00 \le x \le 7.94$), and preferably in a range of 7.20 or more and 7.90 or less ($7.20 \le x \le 7.90$), more preferably in a range of 7.30 or more and 7.80 or less ($7.30 \le x \le 7.80$), even more preferably in a range of 7.40 or more and 7.70 or less ($7.40 \le x \le 7.70$).

The chlorosilicate fluorescent material contains Eu, which is an activating element, in a molar ratio range of 0.01 or more and 1.00 or less, and preferably in a molar ratio range of 0.05 or more and 0.90 or less, more preferably in a molar ratio range of 0.10 or more and 0.80 or less, even more preferably in a molar ratio range of 0.15 or more and 0.60 or less. When the chlorosilicate fluorescent material contains Eu, which is an activating element, in a molar ratio range of 0.01 or more and 1.00 or less, the chlorosilicate fluorescent material absorbs light emitted from the light source to excite electrons of Eu, and the wavelength of the light emitted from the light source can be converted by the excitation energy. When the chlorosilicate fluorescent material contains Eu in a molar ratio range of 0.01 or more and 1.00 or less, for example, the chlorosilicate fluorescent material can absorb light emitted from the light source, which has a light emission peak wavelength in a range of 250 nm or more and 485 nm or less, to thereby emit light having a light emission peak wavelength in a range of 495 nm or more and 548 nm or less. In addition, when the chlorosilicate fluorescent material contains Eu in a molar ratio range of 0.01 or more and 1.00 or less, the light emission efficiency can be enhanced, rather than lowering the light emission efficiency due to concentration quenching. In the chlorosilicate fluorescent material having a chemical composition represented by the formula (I), the parameter y representing a molar ratio of Eu is in a range of 0.01 or more and 1.00 or less ($0.01 \le y \le 1.00$), and preferably in a range of 0.05 or more and 0.90 or less ($0.05 \le y \le 0.90$), more preferably in a range of 0.10 or more and 0.80 or less ($0.10 \le y \le 0.80$), even more preferably in a range of 0.15 or more and 0.60 or less ($0.15 \le y \le 0.60$).

In order to obtain a stable crystal structure, the chlorosilicate fluorescent material contains Mg in 1 mol of the chemical composition in a molar ratio range of 0.90 or more and 1.10 or less, and preferably in a molar ratio range of 0.95 or more and 1.05 or less. In the fluorescent material having a chemical composition represented by the formula (I), in order to obtain a stable crystal structure, the parameter z representing a molar ratio of Mg in the composition is in a range of 0.90 or more and 1.10 or less (0.90≤z≤1.10), and preferably in a range of 0.95 or more and 1.05 or less (0.95≤z≤1.05).

In order to obtain a stable crystal structure, the chlorosilicate fluorescent material contains O in 1 mol of the chemical composition in a molar ratio range of 15.60 or more and 16.10 or less, and preferably in a molar ratio range of 15.73 or more and 16.05 or less, more preferably in a molar ratio range of 15.78 or more and 16.00 or less. In the chlorosilicate fluorescent material having a chemical composition represented by the formula (I), in order to obtain a stable crystal structure, the parameter a representing a molar ratio of O in the composition is in a range of 15.60 or more and 16.10 or less (15.60≤a≤16.10), and preferably in a range of 15.73 or more and 16.05 or less (15.73≤a≤16.05), more preferably in a range of 15.78 or more and 16.00 or less (15.78≤a≤16.00). The parameter a representing a molar ratio of O in the chemical composition represented by the formula (I) can be calculated from the parameters x, y, z, and b representing a molar ratio of each element other than O, which constitutes the fluorescent material, according to the following formula (1).

$$a = x + y + z + (4 \times 2) - (b \div 2) \quad (1)$$

The fluorescent material is preferably a fluorescent material comprising the chlorosilicate fluorescent material as a fluorescent material core, and at least one oxide selected from the group consisting of $Al_2O_3$, $SiO_2$, $ZrO_2$, and $TiO_2$ is adhered on the surface of the fluorescent material core.

Since the chlorosilicate fluorescent material contains chlorine in the composition, it tends to deteriorate in a high temperature and high humidity environment. By adhering at least one oxide selected from the group consisting of $Al_2O_3$, $SiO_2$, $ZrO_2$, and $TiO_2$ on the surface of the fluorescent material core comprising or composed of the chlorosilicate fluorescent material, the fluorescent material may suppress deterioration of the surface in a high temperature and high humidity environment, and the durability of the light emitting device using the chlorosilicate fluorescent material can be improved.

Examples of the method for adhering at least one oxide selected from the group consisting of $Al_2O_3$, $SiO_2$, $ZrO_2$, and $TiO_2$ on the surface of the fluorescent material core comprising or composed of the chlorosilicate fluorescent material may include a forming method using a metal alkoxide-containing solution containing at least one metal element selected from the group consisting of Al, Si, Zr, and Ti according to a sol-gel method. In order to suppress the deterioration of the fluorescent material core, the oxide to be adhered on the surface of the fluorescent material core is preferably adhered in a film shape on the surface of the fluorescent material core, and is more preferably adhered in a film shape on the entire surface of the fluorescent material core.

The amount of the oxide to be adhered on the surface of the fluorescent material core is preferably in a range of 2 parts by mass or more and 30 parts by mass or less relative to 100 parts by mass of the fluorescent material core in terms of metal contained in the oxide, more preferably in a range of 3 parts by mass or more and 25 parts by mass or less, even more preferably in a range of 4 parts by mass or more and 24 parts by mass or less. The amount of the oxide to be adhered on the surface of the fluorescent material core may be in a range of 2 parts by mass or more and 20 parts by mass or less relative to 100 parts by mass of the fluorescent material core in terms of metal contained in the oxide, and may be in a range of 3 parts by mass or more and 10 parts by mass or less. Specifically, the metal contained in the oxide to be adhered on the surface of the fluorescent material core is, for example, at least one element selected from the group consisting of Al, Si, Zr, and Ti. When the amount of the oxide to be adhered on the surface of the fluorescent material core is in a range of 2 parts by mass or more and 30 parts by mass or less relative to 100 parts by mass of the fluorescent material core in terms of metal contained in the oxide, the oxide can be adhered in a film shape on the surface of the fluorescent material core, so that the deterioration of the surface of the chlorosilicate fluorescent material can be suppressed even in an environment of high temperature and high humidity, and the durability of the light emitting device using the chlorosilicate fluorescent material can be improved. When the amount of the oxide to be adhered on the surface of the fluorescent material core is in a range of 2 parts by mass or more and 20 parts by mass or less relative to 100 parts by mass of the fluorescent material core in terms of metal contained in the oxide, a relatively thin film-shaped oxide can be adhered on the surface of the fluorescent material core, so that the particle diameter of the chlorosilicate fluorescent material can be reduced. By reducing the particle diameter of the chlorosilicate fluorescent material in which the oxide is adhered on the surface of the fluorescent material core, the chlorosilicate fluorescent material can be unevenly distributed the light emission side in the fluorescent member, so that the light of which the wavelength is converted by the chlorosilicate fluorescent material is easily extracted from the light emitting device, and the relative luminous flux of the light emitting device can be enhanced.

The particle diameter of the chlorosilicate fluorescent material is preferably 2.0 μm or more, more preferably 4.0 μm or more, even more preferably 5.0 μm or more; and preferably 30.0 μm or less, more preferably 25.0 μm or less. When the particle diameter of the chlorosilicate fluorescent material is in a range of 2.0 μm or more and 30.0 μm or less, the conversion efficiency of light emitted from the light source can be more enhanced, and the light emission efficiency of the light emitting device using the chlorosilicate fluorescent material can be increased. In addition, when the particle diameter of the chlorosilicate fluorescent material is 30.0 μm or less, the handleability of the fluorescent material is improved, and the workability in the production process for the light emitting device can be improved. The particle diameter of the chlorosilicate fluorescent material means a particle diameter (hereinafter also referred to as "volume median diameter") where the volume cumulative frequency from the small diameter side measured by a laser diffraction particle size distribution measuring apparatus reaches 50%. As the laser diffraction particle size distribution measuring apparatus, a Master Sizer 3000 manufactured by Malvern Instruments Ltd. can be used.

The chlorosilicate fluorescent material may contain at least one element selected from the group consisting of Sr, Ba, and Al; and at least one element selected from the group consisting of Sr, Ba, and Al may be contained in a ratio of 360 ppm by mass or less relative to 100% by mass of the chlorosilicate fluorescent material. Sr and Ba are elements belonging to the same group as Ca constituting the composition of the chlorosilicate fluorescent material and are contained in the compound containing Ca which is a raw material of the chlorosilicate fluorescent material, and thus Sr and Ba may be mixed in the fluorescent material. In addition, Al may be contained in the compound containing Si which is a raw material of the chlorosilicate fluorescent material and may be used as a material of a dispersion medium used in the production of the fluorescent material, and thus Al may be mixed at the time of producing the fluorescent material. Even in the case where the chlorosilicate fluorescent material contains at least one element selected from Sr, Ba, and Al which are elements other than the element constituting the composition, the light emission efficiency is not lowered as long as the content ratio is 360 ppm by mass or less. In the case where the chlorosilicate fluorescent material contains two or more elements selected from the group consisting of Sr, Ba, and Al, the total content of the two or more elements may be 360 ppm by mass or less relative to 100% by mass of the fluorescent material. The chlorosilicate fluorescent material is able to maintain high light emission efficiency even when the chlorosilicate fluorescent material contains at least one element selected from the group consisting of Sr, Ba, and Al, when the element is in a ratio of 360 ppm by mass or less relative to 100% by mass of the chlorosilicate fluorescent material. However, the content of at least one element selected from the group consisting of Sr, Ba, and Al in the chlorosilicate fluorescent material may be 350 ppm by mass or less, 300 ppm by mass or less, or 250 ppm by mass or less.

Method for Producing Fluorescent Material

The method for producing a fluorescent material may comprise: providing a compound containing Ca, a compound containing Eu, a compound containing Mg, a compound containing Si, and a compound containing Cl such that a molar ratio of Ca is in a range of 7 or more and 8.2 or less, a molar ratio of Eu is in a range of 0.01 or more and 1.1 or less, a molar ratio of Mg is in a range of 0.9 or more and 1.1 or less, a total molar ratio of Ca and Eu is in a range of 8.05 or more and 8.25 or less, and a molar ratio of Cl is in a range of 2.0 or more and 3.0 or less when a molar ratio of Si in the compound containing Si is set as 4; mixing each of the compound containing Ca, the compound containing Eu, the compound containing Mg, the compound containing Si, and the compound containing Cl to obtain a raw material mixture; and calcining the raw material mixture to obtain a chlorosilicate fluorescent material, wherein at least one of the compound containing Eu, the compound containing Mg, and the compound containing Si is an oxide, and the compound containing Cl optionally contains Ca or Mg.

Compounds

As the compound containing Ca, the compound containing Eu, and the compound containing Mg, a halogen salt, an oxide, a carbonate, a phosphate, and a silicate or an ammonium salt containing each element can be used respectively. As the compound containing Si, an oxide, a hydroxide, an oxynitride compound, a nitride compound, an imide compound, and an amide compound each containing Si can be used. The compound containing Cl may be a chloride containing Ca or Mg. Specific examples of the compound containing Ca may include $CaF_2$, $CaCl_2$), and $CaCO_3$. Examples of the compound containing Eu may include metal europium, $Eu_2O_3$, EuN, an imide compound containing Eu, and an amide compound containing Eu. Examples of the compound containing Mg may include $MgF_2$, $MgCl_2$, MgO, and $MgCO_3$. Examples of the compound containing Si may include a single substance of Si, $SiO_2$, $Si_3N_4$, and $Si(NH_2)_2$. Examples of the compound containing Cl may include $CaCl_2$) and $MgCl_2$.

The compound containing Ca and the compound containing Eu are weighed such that a molar ratio of Ca is in a range of 7 or more and 8.2 or less, a molar ratio of Eu is in a range of 0.01 or more and 1.1 or less, and a total molar ratio of Ca and Eu is in a range of 8.05 or more and 8.25 or less when a molar ratio of Si is set as 4. When the compound containing Ca and the compound containing Eu are weighed so as to be the molar ratios in the above range, the total molar ratio of Ca and Eu in the obtained fluorescent material can be a value close to 8 which is a molar ratio in the theoretical composition of the chlorosilicate and cannot be 8 or more. By adjusting the total molar ratio of Ca and Eu in the obtained fluorescent material as described above, Ca is bound to the silicate not to form the dual phase of the calcium silicate, and a fluorescent material having high light emission efficiency can be thus produced. The compound containing Ca is weighed such that a molar ratio of Ca is preferably in a range of 7.2 or more and 8.1 or less, more preferably in a range of 7.4 or more and 8.0 or less, even more preferably in a range of 7.5 or more and 7.9 or less when a molar ratio of Si is set as 4. The compound containing Eu is weighed such that a molar ratio of Eu is preferably in a range of 0.05 or more and 1.0 or less, more preferably in a range of 0.10 or more and 0.9 or less, even more preferably in a range of 0.12 or more and 0.8 or less when a molar ratio of Si is set as 4. Also, the compound containing Ca and the compound containing Eu are weighed such that a total molar ratio of Ca and Eu is preferably in a range of 8.05 or more and 8.24 or less when a molar ratio of Si is set as 4.

In order to obtain a fluorescent material having a stable crystal structure, the compound containing Mg is weighed such that a molar ratio of Mg is in a range of 0.9 or more and 1.1 or less, preferably in a range of 0.95 or more and 1.05 or less when a molar ratio of Si is set as 4.

The compound containing Cl is weighed such that a molar ratio of Cl is in a range of 2.0 or more and 3.0 or less, preferably in a range of 2.1 or more and 2.8 or less, more preferably in a range of 2.2 or more and 2.7 or less when a molar ratio of Si is set as 4. When a molar ratio of Cl in 1 mol of the chemical composition contained in the obtained fluorescent material is small as 1.90 or less, defects may occur in the host crystal of the obtained fluorescent material, and the raw materials are readily scattered at the time of heat treating. Thus, the compound containing Cl is preferably contained in a molar ratio of 2 or more in the theoretical composition of the chlorosilicate. In the case where the compound containing Cl contains elements other than Cl, which constitute the chemical composition of the fluorescent material, the compound containing Cl is preferably weighed such that a molar ratio of each element constituting the chemical composition of the fluorescent material is in the above molar ratio range.

Raw Material Mixture

The weighed compounds are mixed in wet or in dry using a mixing machine to obtain a raw material mixture. As the mixing machine, a ball mill which is generally industrially used, as well as a grinding machine such a vibration mill, a roll mill, or a jet mill, can be used. The raw materials can be ground to enlarge the specific surface area. In order to adjust the specific surface area of the particles in a certain range, the raw materials can be classified using: a wet separator such as a sedimentation tank, a hydrocyclone, or a centrifugal separator; or a dry classifier such as a cyclone or an air separator, which are generally industrially used.

Flux

The raw material mixture may contain a flux. When the raw material mixture contains a flux, the reaction between the raw materials can be promoted and further the solid-phase reaction can proceed more uniformly, and therefore a calcined product to be used for obtaining a fluorescent material having more excellent light emission characteristics can be produced. For example, when the heat treatment temperature for providing the calcined product is in a range of 1,000° C. or more and 1,250° C. or less, and when a halide is used as the flux, it may be considered that the temperature in the range is substantially the same as the formation temperature of the halide liquid phase, so that the solid-phase reaction between the raw materials can proceed more uniformly. As the halide to be used as the flux, a rare earth metal such as cerium or europium, a chloride or fluoride of alkali metal, can be used. The flux can be added as a part of the raw materials of the fluorescent material by adjusting the elemental ratio of the cation contained in the flux to be a composition of the desired calcined product, or the flux can be added thereto after blending the raw materials to be a composition of the desired calcined product.

The flux component promotes reactivity, but when the amount of the flux contained in the raw material mixture is too large, the light emission efficiency of the obtained fluorescent material may be lowered. Therefore, for example, the content of the flux in the raw material mixture is preferably 10% by mass or less, more preferably 5% by mass or less.

Calcination

The raw material mixture may be placed in a crucible or a boat made of SiC, quartz, alumina, BN or the like, and calcined in a furnace. By calcining the raw material mixture, a powdery calcined product can be obtained.

A calcination temperature at which calcining the raw material mixture is performed is preferably in a range of 1,000° C. or more and 1,300° C. or less, more preferably in a range of 1,100° C. or more and 1,250° C. or less. When the calcination temperature is in a range of 1,000° C. or more and 1,300° C. or less, a calcined product having a chemical composition containing Ca, Eu, Mg, Si, O, and Cl may be obtained without being decomposed by too high calcination temperature. In the calcination, a second calcination may be performed after performing a first calcination, or a plurality of calcinations may be performed.

The time of the single calcination is preferably in a range of 1 hour or more and 30 hours or less. In the single calcination, the calcination can be performed by changing the temperature stepwise. For example, the calcination may be performed in two-stage calcination (multistage calcination) in such a manner that the first-stage calcination is performed at a temperature in a range of 800° C. or more and 1,000° C. or less, then the temperature is gradually increased, and the second-stage calcination is performed at a temperature in a range of 1,000° C. or more and 1,300° C. or less.

The calcination of the raw material mixture is preferably performed in a reducing nitrogen atmosphere. The calcination atmosphere is more preferably a reducing nitrogen atmosphere containing hydrogen gas. The calcination atmosphere may also be a reducing atmosphere using a solid carbon in an air atmosphere.

By calcining the raw material mixture in an atmosphere having a high reducing power, such as a reducing atmosphere containing hydrogen and nitrogen, a calcined product for providing a chlorosilicate fluorescent material having high light emission efficiency and capable of emitting green light can be produced. The calcined product that is calcined in an atmosphere having a high reducing power has high light emission efficiency because the content ratio of $Eu_{2+}$ contained in the calcined product increases. The divalent Eu is readily oxidized into a trivalent Eu, but by calcining the raw material mixture in a highly-reducing atmosphere containing hydrogen and nitrogen, $Eu_{3+}$ contained in the calcined product is reduced into $Eu_{2+}$. Therefore, the content ratio of $Eu_{2+}$ contained in the calcined product increases, and a fluorescent material having high light emission efficiency can be produced.

Post-Treatment after Calcining

The calcined product may be subjected to post-treatments such as grinding, dispersion, solid-liquid separation, and drying. The solid-liquid separation can be performed according to an ordinary industrial method such as filtration, suction filtration, pressure filtration, centrifugation, or decantation. The drying can be performed using an ordinary industrial apparatus such as a vacuum drier, a hot air heating drier, a conical drier, or a rotary evaporator. A powdery fluorescent material can be produced by subjecting the calcined product to the post-treatments as required.

Adhesion of Oxide

The obtained chlorosilicate fluorescent material used as a fluorescent material core may be brought into contact with a metal alkoxide-containing solution containing at least one element selected from the group consisting of Al, Si, Zr, and Ti for hydrolysis of the metal alkoxide followed by polycondensation, so that an oxide containing at least one metal selected from the group consisting of Al, Si, Zr, and Ti may be adhered thereon. It is preferable that at least one oxide selected from the group consisting of $Al_2O_3$, $SiO_2$, $ZrO_2$, and $TiO_2$ is adhered on the fluorescent material core according to a sol-gel method. When at least one oxide selected from the group consisting of $Al_2O_3$, $SiO_2$, $ZrO_2$, and $TiO_2$ is adhered, preferably in a film form, on the fluorescent material core composed of the chlorosilicate fluorescent material. Thereby, the film-shaped oxide may function as a protective film to suppress the deterioration of the fluorescent material due to the external environment, and the durability of a light emitting device using the fluorescent material may be thus improved.

The metal alkoxide is preferably a silane compound having 2 or more alkoxyl groups, and specific examples thereof may include methyltrimethoxysilane, methyltriethoxysilane, ethyltrimethoxysilane, ethyltriethoxysilane, propyltrimethoxysilane, propyltriethoxysilane, tetramethoxysilane, tetraethoxysilane, tetrapropoxysilane, titanium tetrapropoxide, titanium tetrabutoxide, aluminum triethoxide, aluminum tripropoxide, aluminum tributoxide, zirconium tetrapropoxide, and zirconium tetrabutoxide. In consideration of workability and easy availability, the metal alkoxide is preferably tetraethoxysilane.

The metal alkoxide-containing solution preferably contains an organic solvent in consideration of workability.

The organic solvent contained in the metal alkoxide-containing solution is preferably a polar organic solvent, and examples thereof may include ethyl acetate, tetrahydrofuran, N,N-diethylformamide, dimethyl sulfoxide, alcohols having a linear or branched alkyl group with 1 to 8 carbon atoms, carboxylic acids such as formic acid and acetic acid, and ketones such as acetone. The polar organic solvent is preferably a lower alcohol or ketone each having a linear or branched alkyl group with 1 to 3 carbon atoms. The polar organic solvent is more preferably ethanol or ketone having a relative permittivity of 18 to 33. Specifically, the solvent is more preferably at least one selected from the group consisting of methanol (relative permittivity of 33), ethanol (relative permittivity of 24), 1-propanol (relative permittivity of 20), 2-propanol (relative permittivity of 18), and acetone (relative permittivity of 21). When the metal alkoxide-containing solution contains an acid or alkali catalyst, the hydrolysis rate of the metal alkoxide can be accelerated.

Examples of the acid or alkali solution to be the catalyst may include a hydrochloric acid solution and an ammonia solution.

The powdery chlorosilicate fluorescent material may be brought into contact with the metal alkoxide-containing solution for hydrolysis of the metal alkoxide followed by polycondensation, so that at least one oxide selected from the group consisting of $Al_2O_3$, $SiO_2$, $ZrO_2$, and $TiO_2$ is adhered thereon as a main component. For example, in the case where the metal alkoxide is tetraethoxysilane ($Si(OC_2H_5)_4$), the calcined product is brought into contact with a solution containing tetraethoxysilane ($Si(OC_2H_5)_4$) and the tetraethoxysilane is hydrolyzed to form orthosilicic acid ($Si(OH)_4$), and then dehydration reaction runs on through polycondensation of the orthosilicic acid ($Si(OH)_4$), so that a silica ($SiO_2$) is adhered in a film form on the surface of the fluorescent material core as a main component.

Light Emitting Device

A light emitting device using the fluorescent material as a constituent element of a wavelength converting member will be described. The light emitting device according to the present disclosure contains a chlorosilicate fluorescent material and an excitation light source. The light source has a light emission peak wavelength in a range of 250 nm or more and 485 nm or less. The chlorosilicate fluorescent material preferably has a light emission peak wavelength in a range of 495 nm or more and 548 nm or less by absorbing light emitted from the light source.

Figure 1:
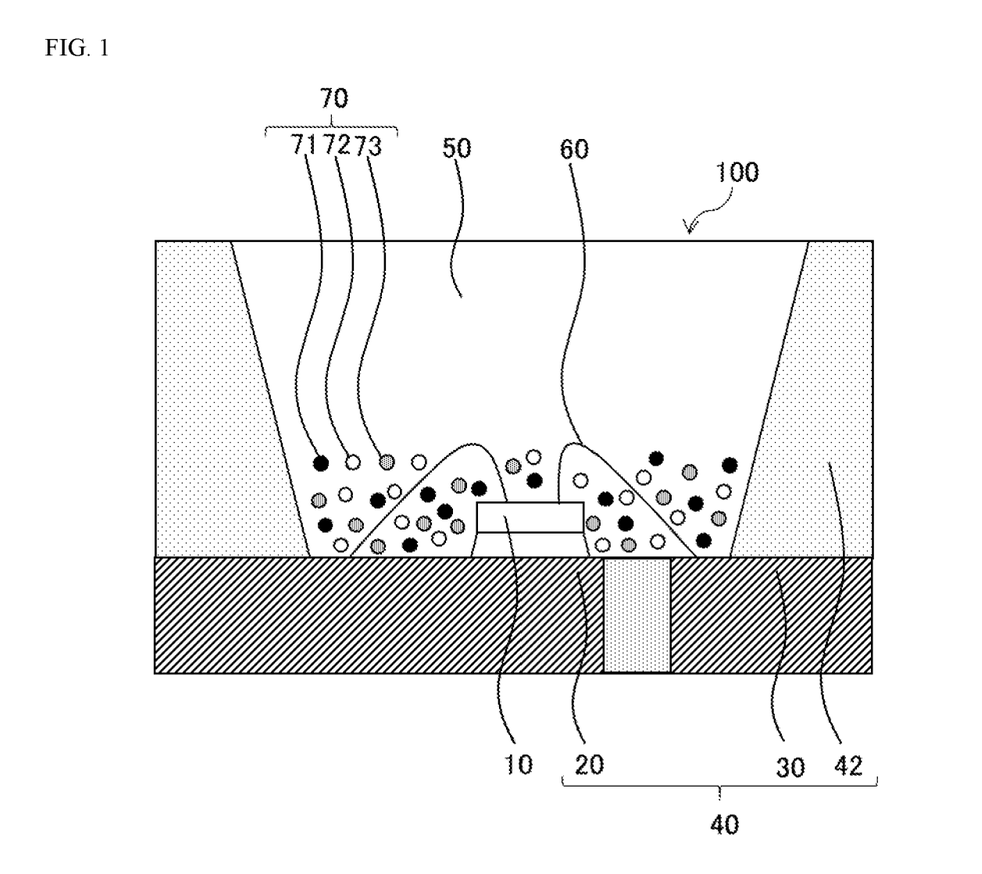
FIG. 1 is a schematic cross-sectional view showing an example of a light emitting device according to the present disclosure.

One example of the light emitting device will be described with reference to the drawing. FIG. 1 is a schematic cross-sectional view showing an example of the light emitting device.

Alight emitting device 100 is provided with a molded body 40 having a recessed part, a light emitting element 10 serving as a light source, and a fluorescent member 50 to cover the light emitting element 10. The molded body 40 is composed of a first lead 20 and a second lead 30 as integrally molded with a resin part 42 containing a thermoplastic resin or a thermosetting resin. In the molded body 40, the first lead 20 and the second lead 30 each constituting the bottom surface of the recessed part are disposed, and the resin part 42 constituting the side surface of the recessed part is disposed. The light emitting element 10 is mounted on the bottom surface of the recessed part of the molded body 40. The light emitting element 10 has a pair of positive and negative electrodes, and the pair of positive and negative electrodes each are individually electrically connected to the first lead 20 and the second lead 30 via wires 60. The light emitting element 10 is covered with the fluorescent member 50. The fluorescent member 50 contains a fluorescent material 70 that undergoes wavelength conversion of light emitted from the light emitting element 10. The fluorescent material 70 contains a chlorosilicate fluorescent material as a first fluorescent material 71, and may contain a second fluorescent material 72 and a third fluorescent material 73 each having a light emission peak wavelength range different from that of the first fluorescent material. The fluorescent member 50 functions not only as a wavelength converting member but also as a member for protecting the light emitting element 10, the first fluorescent material 71, the second fluorescent material 72, and the third fluorescent material 73 from an external environment. The light emitting device 100 emits light upon receiving external power via the first lead 20 and the second lead 30.

The method for producing a light emitting device preferably includes: preparing a molded body having a recessed part, which is integrally molded with a first lead, a second lead, and a resin part; mounting a light emitting element on the first lead and electrically connecting a pair of electrodes of the light emitting element to the first lead and the second lead respectively using wires; and disposing a resin composition containing a first fluorescent material, optionally a second fluorescent material and a third fluorescent material, and a resin in the recessed part of the molded body and curing the resin composition to form a fluorescent member. The resin composition can be disposed in the recessed part of the molded body by dropping (potting) using, for example, an ejection apparatus (dispenser).

Light Emitting Element

For the light source, a light emitting element can be used. The light emitting element emits light in a wavelength range of 250 nm or more and 485 nm or less. In order to efficiently excite the fluorescent material, the light emitting element preferably has a light emission peak wavelength in a range of 300 nm or more and 480 nm or less, more preferably in a range of 350 nm or more and 480 nm or less. When the light emitting element is used as the excitation light source, a light emitting device capable of emitting a mixed color light of light from the light emitting element and fluorescence from the fluorescent material, which has a desired color temperature and color tone, can be constituted.

The full width at half maximum of the light emission peak in the light emission spectrum of the light emitting element may be, for example, 30 nm or less. For the light emitting element, a semiconductor light emitting element is preferably used. Using a semiconductor light emitting element as a light source enables a high efficiency stable light emitting device that has high linearity of output relative to input and is resistant to mechanical shock to be obtained. For example, a semiconductor light emitting element using a nitride-based semiconductor ($In_XAl_YGa_{1-X-Y}N$, $0 \leq X$, $0 \leq Y$, $X+Y \leq 1$) can be used as the semiconductor light emitting element. The full width at half maximum of the fluorescent material and the full width at half maximum of the light emitting element means a wavelength width of the light emission spectrum showing a value of 50% of the maximum light emission intensity in the light emission spectrum.

Fluorescent Member

First Fluorescent Material

The fluorescent member contains a chlorosilicate fluorescent material as a first fluorescent material, and may contain a second fluorescent material and a third fluorescent material each having a light emission peak wavelength range different from that of the first fluorescent material. The first fluorescent material is preferably a fluorescent material comprising a fluorescent material core composed of a chlorosilicate fluorescent material, which has durability even in an environment of high temperature and high humidity, wherein at least one oxide selected from the group consisting of $Al_2O_3$, $SiO_2$, $ZrO_2$, and $TiO_2$ is adhered on the surface of the fluorescent material core.

The first fluorescent material can be, for example, contained in the fluorescent member that covers the light source to constitute the light emitting device. In the light emitting device where the light source is covered with the fluorescent member containing the first fluorescent material, a part of light emitted from the light source is absorbed by the first fluorescent material, and is emitted by being converted into green light having a light emission peak wavelength in a range of 495 nm or more and 548 nm or less. When the light source capable of emitting light in a wavelength range of 250 nm or more and 485 nm or less is used, a part of the emitted light can be more effectively utilized by the fluorescent material in the fluorescent member.

The amount of the first fluorescent material contained in the light emitting device may be appropriately selected in accordance with the color to be finally obtained. The content of the first fluorescent material can be in a range of 2 parts by mass or more and 200 parts by mass or less relative to 100 parts by mass of the resin contained in the fluorescent member, may be in a range of 10 parts by mass or more and 100 parts by mass or less, and is preferably in a range of 10 parts by mass or more and 50 parts by mass or less.

The fluorescent member may contain a second fluorescent material and a third fluorescent material each having a light emission peak wavelength range different from that of the first fluorescent material. For example, when the light emitting device appropriately comprises a light emitting element capable of emitting blue light, a first fluorescent material to be excited with the light, and optionally a second fluorescent material and a third fluorescent material, a mixed color light having a desired color temperature and having a broad color reproducibility range or a high color rendering property can be emitted.

Second Fluorescent Material

As the second fluorescent material, for example, a yellow fluorescent material having a light emission peak wavelength in a range of 530 nm or more and 580 nm or less by absorbing light emitted from the light source in a wavelength range of 250 nm or more and 485 nm or less can be used. Examples of the second fluorescent material may include fluorescent materials represented by $(Ca,Sr,Ba)_2SiO_4$:Eu, $Si_{6-w}Al_wO_wN_{8-w}$:Eu $(0<w\leq4.2)$, $(Sr,Ba,Ca)Ga_2S_4$:Eu, $(La,Y,Gd,Lu)_3(Ga,Al)_5O_{12}$:Ce, $(La,Y,Gd)_3Si_6N_{11}$:Ce, $Ca_3Sc_2Si_3O_{12}$:Ce, $CaSc_2O_4$:Ce, $K_2(Si,Ge,Ti)F_6$:Mn, $(Ca,Sr,Ba)_2Si_5N_8$:Eu, and $(Sr,Ba,Ca)_8MgSi_4O_{16}(F,Cl,Br)_2$:Eu (chlorosilicate fluorescent materials having compositions different from that of the first fluorescent material).

In the composition representing a fluorescent material, plural elements sectioned by the comma (,) in parentheses mean that at least one of these plural elements is contained in the composition. The plural elements sectioned by the comma (,) in parentheses in the composition mean that at least one element selected from the plural elements thus sectioned by the comma is contained in the composition, and two or more elements selected from the plural elements may be contained therein in combination. In the composition representing a fluorescent material, the part before the colon (:) represents elements constituting a host crystal and molar ratios of these, and the part after the colon (:) represents an activating element.

The amount of the second fluorescent material contained in the light emitting device may be appropriately selected in accordance with the color to be finally obtained. The content of the second fluorescent material contained in the fluorescent member can be in a range of 1 part by mass or more and 150 parts by mass or less relative to 100 parts by mass of the resin contained in the fluorescent member, may be in a range of 1 part by mass or more and 100 parts by mass or less, and is preferably in a range of 2 parts by mass or more and 50 parts by mass or less.

Third Fluorescent Material

As the third fluorescent material, for example, a yellow fluorescent material having a light emission peak wavelength in a range of 610 nm or more and 790 nm or less by absorbing light emitted from the light source in a wavelength range of 250 nm or more and 485 nm or less can be used. Examples of the third fluorescent material may include $CaAlSiN_3$:Eu, $(Ca,Sr)AlSiN_3$:Eu, $(Sr,Ca)LiAl_3N_4$:Eu, $(Ca,Sr)_2Mg_2Li_2Si_2N_6$:Eu, and $3.5MgO\cdot0.5MgF_2\cdot GeO_2$:Mn.

The amount of the third fluorescent material contained in the light emitting device may be appropriately selected in accordance with the color to be finally obtained. The content of the third fluorescent material contained in the fluorescent member can be in a range of 1 part by mass or more and 150 parts by mass or less relative to 100 parts by mass of the resin contained in the fluorescent member, may be in a range of 1 part by mass or more and 100 parts by mass or less, and is preferably in a range of 2 parts by mass or more and 50 parts by mass or less.

The total content of the fluorescent materials in the fluorescent member can be, for example, in a range of 5 parts by mass or more and 300 parts by mass or less relative to 100 parts by mass of the resin, and is preferably in a range of 10 parts by mass or more and 250 parts by mass or less, more preferably in a range of 15 parts by mass or more and 230 parts by mass or less, even more preferably in a range of 15 parts by mass or more and 200 parts by mass or less. When the total content of the fluorescent materials in the fluorescent member falls within the above range, the wavelength of light emitted from the light emitting element can be efficiently converted by the fluorescent materials.

Examples of the resin constituting the fluorescent member may include thermosetting resins such as a silicone resin, an epoxy resin, an epoxy-modified silicone resin, and a modified silicone resin.

The fluorescent member may further contain a filler, a light diffusing material in addition to the resin and the fluorescent material. For example, when containing a filler or a light diffusing material, the directionality from the light emitting element is relaxed, so that the viewing angle can be enlarged. Examples of the filler or the light diffusing material may include silica, titanium oxide, zinc oxide, zirconium oxide, and alumina. In the case where the fluorescent member contains a filler or a light diffusing material, the content of the filler or the light diffusing material can be, for example, in a range of 1 part by mass or more and 20 parts by mass or less relative to 100 parts by mass of the resin.

EXAMPLES

The present disclosure is hereunder specifically described by reference to the following Examples. The present disclosure is not limited to these Examples.

Example 1

$CaCO_3$, $Eu_2O_3$, MgO, $SiO_2$, and $CaCl_2$) were used as raw materials. These raw materials were weighed as a charged amount such that a molar ratio of each element was Ca:Eu:Mg:Si:Cl=7.75:0.3:1:4:2.5 when a molar ratio of Si was set as 4, and then mixed to obtain a raw material mixture. The molar ratio of each element was calculated by modifying the purity of each raw material to 100% by mass. Since Cl scatters during calcining, Cl was blended in an amount larger than a value of the desired composition ratio (molar ratio). The raw material mixture was filled into an alumina boat and then calcined at 1,170° C. for 12 hours in a hydrogen nitrogen atmosphere which is a reducing atmosphere to obtain a calcined product having a composition represented by $Ca_{7.55}Eu_{0.20}Mg_{0.98}Si_4O_{15.79}Cl_{1.91}$. Since the particles of the obtained calcined product were sintered together, the obtained calcined product was ground with alumina beads and subjected to wet dispersion followed by sieve classification to eliminate coarse particles and fine particles, thereby obtaining a chlorosilicate fluorescent material powder.

Examples 2 to 5 and Comparative Examples 1 to 3

Using the same raw materials as in Example 1, a chlorosilicate fluorescent material powder in each of Examples and Comparative Examples was obtained in the same manner as in Example 1 except that, as a charged amount of the raw materials, Ca, Eu, Mg, Si, and Cl were weighed so as to be the charged molar ratios shown in Table 1 when a molar ratio of Si was set as 4.

Comparative Example 4

Using the same raw materials as in Example 1, a chlorosilicate fluorescent material powder in Comparative Example 4 was obtained in the same manner as in Example 1 except that, as a charged amount of the raw materials, Ca, Eu, Mg, Si, and Cl were weighed so as to be the charged molar ratios shown in Table 1 when a molar ratio of Si was set as 4.

TABLE 1

| | Charged Molar Ratio | | | | |
|---|---|---|---|---|---|
| | Ca | Eu | Mg | Si | Cl |
| Comparative Example 1 | 7.70 | 0.30 | 1.00 | 4.00 | 2.50 |
| Example 1 | 7.75 | 0.30 | 1.00 | 4.00 | 2.50 |
| Example 2 | 7.80 | 0.31 | 1.00 | 4.00 | 2.50 |
| Example 3 | 7.85 | 0.31 | 1.00 | 4.00 | 2.50 |
| Example 4 | 7.90 | 0.31 | 1.00 | 4.00 | 2.50 |
| Comparative Example 2 | 7.95 | 0.31 | 1.00 | 4.00 | 2.50 |
| Comparative Example 3 | 7.50 | 0.50 | 1.00 | 4.00 | 2.50 |
| Example 5 | 7.60 | 0.51 | 1.00 | 4.00 | 2.50 |
| Comparative Example 4 | 8.50 | 0.50 | 1.00 | 4.00 | 3.00 |

Figure 2:
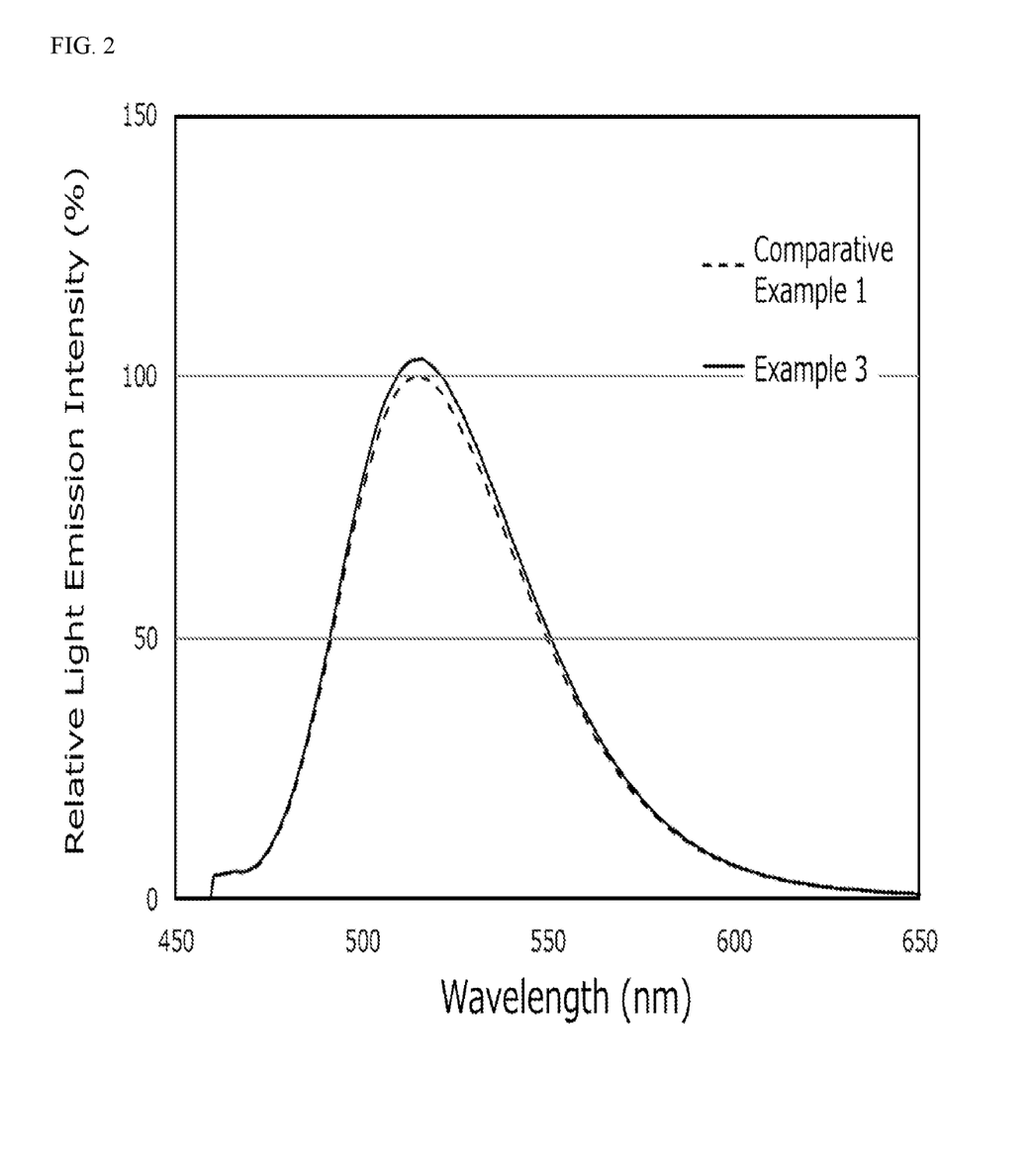
FIG. 2 shows light emission spectra of the fluorescent materials according to Example 3 and Comparative Example 1.

450 nm to measure the light emission spectrum thereof at room temperature (25° C.±5° C.). FIG. 2 is a diagram showing the light emission spectra of the fluorescent materials according to Example 3 and Comparative Example 1. The light emission peak wavelength λp (nm) and the internal quantum efficiency (%) were determined from the obtained light emission spectrum. The internal quantum efficiency (%) was calculated by dividing the number of light emitting quantum (%) by the number of light absorbing quantum (%). The results are shown in Table 2.

Compositional Analysis

Each of the obtained chlorosilicate fluorescent materials was subjected to compositional analysis. Using an inductively coupled plasma-atomic emission spectrometer (ICP-AES) (Optima 8300, manufactured by Perkin Elmer, Inc.), the molar ratios of the elements of Ca, Mg, Si, and Eu in each of the chlorosilicate fluorescent materials were measured. The molar ratio of the Cl element in each of the chlorosilicate fluorescent materials was measured using a potentiometric titrator (AT-500N, manufactured by Kyoto Electronics Manufacturing Co., Ltd.). In the composition of each of the fluorescent materials, the molar ratio of each element other than Si was calculated based on the molar ratio of Si of 4. The results are shown in Table 2 as "analyzed molar ratios".

Particle Diameter

The particle diameter (volume median diameter) of each of the obtained chlorosilicate fluorescent materials at a cumulative volume frequency of 50% from the small-diameter side was measured using a laser diffraction particle size distribution measuring apparatus (product name: Master Sizer 3000, manufactured by Malvern Instruments Ltd.). The results are shown in Table 2.

TABLE 2

| | Volume Median Diameter D50 (μm) | Light Emission Peak Wavelength λp (nm) | Internal Quantum Efficiency (%) | Analyzed Molar Ratio | | | | | | |
|---|---|---|---|---|---|---|---|---|---|---|
| | | | | Ca x | Eu y | Mg z | Si — | O a | Cl b | Ca + Eu x + y |
| Comparative Example 1 | 13.5 | 515 | 90.4 | 7.51 | 0.22 | 0.98 | 4.00 | 15.77 | 1.89 | 7.73 |
| Example 1 | 12.1 | 516 | 91.6 | 7.55 | 0.20 | 0.98 | 4.00 | 15.79 | 1.91 | 7.76 |
| Example 2 | 12.2 | 515 | 92.9 | 7.69 | 0.21 | 0.99 | 4.00 | 15.92 | 1.95 | 7.90 |
| Example 3 | 11.4 | 516 | 93.4 | 7.67 | 0.22 | 1.01 | 4.00 | 15.91 | 1.99 | 7.89 |
| Example 4 | 11.2 | 514 | 91.5 | 7.66 | 0.21 | 1.00 | 4.00 | 15.87 | 2.00 | 7.87 |
| Comparative Example 2 | 12.2 | 514 | 90.4 | 7.67 | 0.22 | 1.01 | 4.00 | 15.89 | 2.01 | 7.89 |
| Comparative Example 3 | 15.3 | 521 | 85.4 | 7.36 | 0.42 | 0.99 | 4.00 | 15.84 | 1.86 | 7.78 |
| Example 5 | 12.2 | 521 | 87.0 | 7.42 | 0.42 | 0.99 | 4.00 | 15.86 | 1.93 | 7.84 |
| Comparative Example 4 | 46.5 | 516 | 30.0 | 7.67 | 0.30 | 1.09 | 4.00 | 16.07 | 1.97 | 7.97 |

Evaluation

Light Emission Characteristics

The light emission characteristics of each of the obtained fluorescent materials were measured. As for the light emission characteristics of each of the fluorescent materials, using a fluorospectrophotometer (QE-2000, manufactured by Otsuka Electronics Co., Ltd.), each fluorescent material was irradiated with light having an excitation wavelength of The internal quantum efficiency of the fluorescent material in each of Examples 1 to 4, which had a light emission peak wavelength of 514 to 516 nm, was higher than that of the fluorescent material in each of Comparative Examples 1 and 2, which had a light emission peak wavelength of 514 to 515 nm. In the fluorescent material in each of Examples 1 to 4, the total value of the parameter x representing a molar ratio of Ca and the parameter y representing a molar ratio of Eu was in a range of 7.70 or more and 7.95 or less (7.70≤x+y≤7.95). Thus, it is presumed that the generation of the dual phase of the calcium silicate was suppressed, and as a result, the internal quantum efficiency was increased. Also, in the fluorescent material in each of Examples 1 to 4, the value of the parameter b representing a molar ratio of Cl was in a range of more than 1.90 and 2.00 or less (1.90<b≤2.00). Thus, it is presumed that the number of defects contained in the host crystal was small, and as a result, the internal quantum efficiency was increased. Accordingly, the fluorescent material in each of Examples 1 to 4 had higher conversion efficiency of the light emitted from the light source than that of the fluorescent material in each of Comparative Examples 1 and 2.

The internal quantum efficiency of the fluorescent material in Example 5, which had a light emission peak wavelength of 521 nm, was higher than that of the fluorescent material in Comparative Example 3, which had the same molar ratio of Eu and light emission peak wavelength. In the fluorescent material in Example 5, the total value of the parameter x representing a molar ratio of Ca and the parameter y representing a molar ratio of Eu was in a range of 7.70 or more and 7.95 or less (7.70≤x+y≤7.95). Thus, it is presumed that the generation of the dual phase of the calcium silicate was suppressed, and as a result, the internal quantum efficiency was increased. Also, in the fluorescent material in Example 5, the value of the parameter b representing a molar ratio of Cl was in a range of more than 1.90 and 2.00 or less (1.90<b≤2.00). Thus, it is presumed that the number of defects contained in the host crystal was small, and as a result, the internal quantum efficiency was increased. Accordingly, the fluorescent material in Example 5 had higher conversion efficiency of the light emitted from the light source than that of the fluorescent material in Comparative Example 3.

In the fluorescent material in Comparative Example 4, the total value of the parameter x representing a molar ratio of Ca and the parameter y representing a molar ratio of Eu was more than 7.95. Thus, it is presumed that the generation of the dual phase of the calcium silicate was not suppressed, and as a result, the light emission efficiency in Comparative Example 4 was much lower than that in Comparative Example 1.

As shown in FIG. 2, even in the light emission spectrum, the light emission intensity at the light emission peak wavelength of the fluorescent material in Example 3 was higher than that of the fluorescent material in Comparative Example 1.

Measurement of Sr, Ba, and Al

As for the fluorescent material in Example 3, the contents of Sr, Ba, and Al in the fluorescent material were measured using the same method as the above compositional analysis. The results are shown in Table 3.

TABLE 3

| | Mass ppm | | |
|---|---|---|---|
| | Sr | Ba | Al |
| Example 3 | 97 | 1 | 140 |

In the fluorescent material in Example 3, the total amount of these elements was 360 ppm by mass or less even in the case where Sr, Ba, and Al were contained, and the light emission efficiency of the fluorescent material in Example 3 was higher than that of the fluorescent material in each of Comparative Examples 1 and 2. From the results, in the chlorosilicate fluorescent material having a chemical composition represented by the formula (I), even in the case where at least one element selected from Sr, Ba, and Al, which were elements other than the elements constituting the composition, was contained, it could be confirmed that the light emission efficiency was not lowered as long as the content ratio was 360 ppm by mass or less.

Example 6

Using the chlorosilicate fluorescent material in Example 3 as a fluorescent material core, $SiO_2$ was adhered in a film form on the surface of the fluorescent material core as a main component. Relative to 100 g of the fluorescent material core, 180 ml of ethanol, 3.3 ml of an aqueous solution containing 3% by mass of ammonium chloride, 3.3 ml of an aqueous solution containing 3% by mass of calcium chloride, and 30 ml of ammonia water containing 18% by mass of ammonium were mixed to prepare a host liquid. The fluorescent material core was put in the host liquid and stirred to disperse the fluorescent material core in the host liquid, and the liquid temperature of the host liquid was maintained at 45 to 55° C. A liquid containing 23.2 g of tetraethoxysilane ($Si(OC_2H_5)_4$) in terms of silica was prepared as a liquid A, and a liquid containing 22.3 ml of ammonia water containing 18% by mass of ammonium, 22.3 ml of deionized water, and 1.5 ml of an aqueous solution containing 3% by mass of ammonium chloride was prepared as a liquid B. While stirring the host liquid, the liquid A and the liquid B were dropped in the host liquid at a dropping rate of 5.6 ml/min for liquid A and 2.2 ml/min for liquid B for a dropping time of 160 minutes to obtain a mixed liquid, and after dropping the liquid A and the liquid B, the mixed liquid was stirred for 30 minutes. Thereafter, the stirring was stopped, and the fluorescent material having $SiO_2$ adhered on the surface of the fluorescent material core was taken out from the mixed liquid and then dried at 100° C. for 15 hours, thereby obtaining a chlorosilicate fluorescent material powder in Example 6, which had $SiO_2$ adhered on the surface of the fluorescent material core.

Comparative Example 5

A chlorosilicate fluorescent material powder in Comparative Example 5, in which $SiO_2$ was adhered on the surface of the fluorescent material core, was obtained in the same manner as in Example 6 except that the chlorosilicate fluorescent material in Comparative Example 1 was used as the fluorescent material core.

The particle diameter, the light emission peak wavelength (λp (nm)), and the internal quantum efficiency (%) of the fluorescent material in each of Example 6 and Comparative Example 5 were measured in the same manner as described above. The results are shown in Table 4.

TABLE 4

| | Fluorescent Material (before $SiO_2$ adhesion) | Volume Median Diameter D50 (μm) | Light Emission Peak Wavelength λp (nm) | Internal Quantum Efficiency (%) |
|---|---|---|---|---|
| Comparative Example 5 | Comparative Example 1 | 24.6 | 515 | 91.2 |
| Example 6 | Example 3 | 22.2 | 516 | 93.4 |

Figure 3:
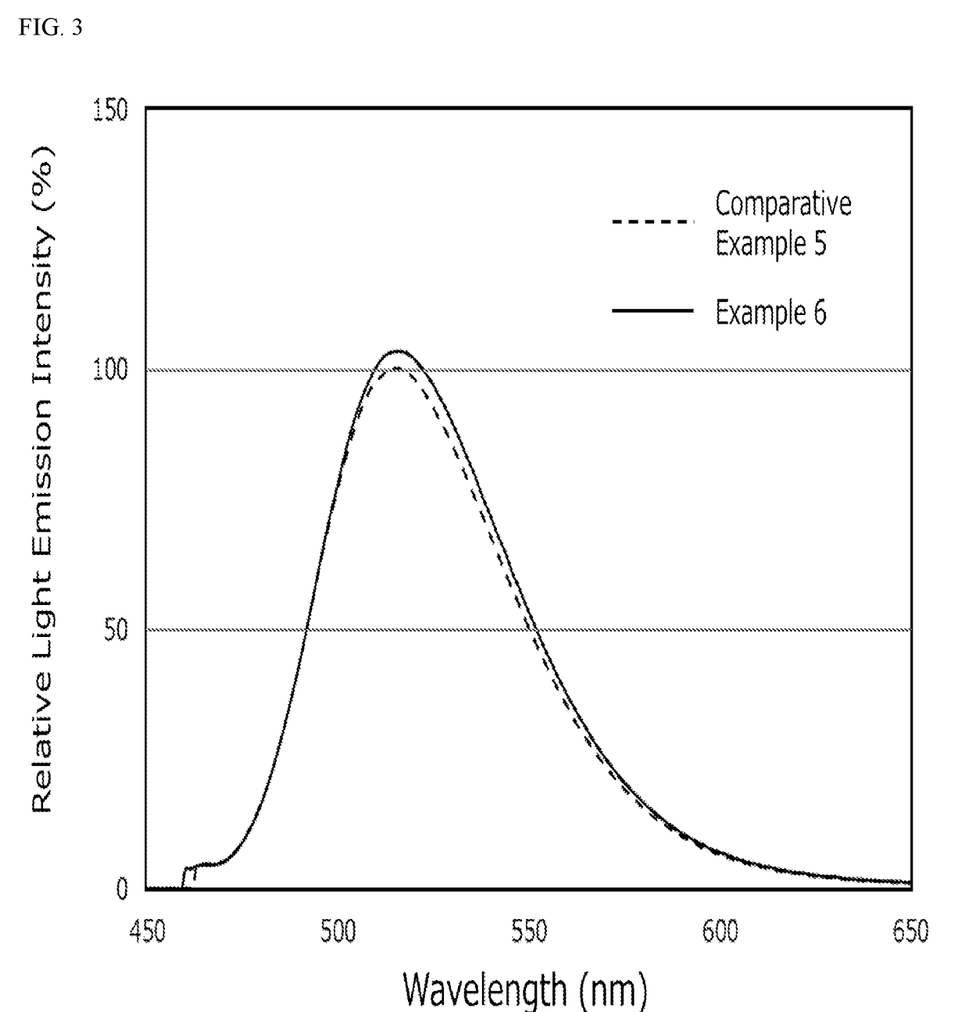
FIG. 3 shows light emission spectra of the fluorescent materials according to Example 6 and Comparative Example 5.

The fluorescent material in Example 6 had an internal quantum efficiency higher than that of the fluorescent material in Comparative Example 5. As shown in FIG. 3, the light emission spectrum of the fluorescent material in Example 6 had a light emission intensity higher than that of the light emission spectrum in Comparative Example 5 in a wavelength range of 495 nm or more and 548 nm or less. From the results, even in the case where $SiO_2$ was adhered on the surface of the fluorescent material core in the chlorosilicate fluorescent material having a chemical composition represented by the formula (I), the light emission efficiency in Example 6 was maintained higher than that in Comparative Example 5. As for the fluorescent material in Example 6, since film-shaped $SiO_2$ was adhered on the surface of the fluorescent material core in the chlorosilicate fluorescent material having a chemical composition represented by the formula (I), the film-shaped $SiO_2$ acted as a protective film to suppress the deterioration, so that the durability could be increased.

Light Emitting Device

Example 7

A light emitting device according to the embodiment shown in FIG. 1 was produced. The chlorosilicate fluorescent material in Example 6 was used as a first fluorescent material, $Y_3Al_5O_{12}$:Ce was used as a second fluorescent material, (Sr,Ca)AlSiN$_3$:Eu was used as a third fluorescent material, and a nitride-based semiconductor light emitting element having a light emission peak wavelength of 456 nm was used as a light emitting element. A light emitting device was produced as follows: the blending amount of each fluorescent material was adjusted such that the correlated color temperature of light from each of the light emitting element, the first fluorescent material, the second fluorescent material, and the third fluorescent material was 5,000 K; a resin composition containing the first fluorescent material, the second fluorescent material, the third fluorescent material, and a silicone resin was prepared; and a fluorescent member, in which the resin composition was disposed by dropping (potting) the resin composition into the recessed part of the molded body using a dispenser and was then cured.

Comparative Example 6

A light emitting device was produced in the same manner as in Example 7 except that the chlorosilicate fluorescent material in Comparative Example 5 was used as a first fluorescent material.

Relative Luminous Flux

Using a total luminous flux measuring apparatus with an integrating sphere, the luminous flux of the light emitting device in each of Example 7 and Comparative Example 6 was measured. The relative luminous flux of the light emitting device in Example 7 was calculated when the luminous flux of the light emitting device in Comparative Example 6 was set as 100%. The results are shown in Table 5.

TABLE 5

| | | Light Emitting Device | |
| --- | --- | --- | --- |
| | Fluorescent Material (after $SiO_2$ adhesion) | Relative Luminous Flux (%) | Color Temperature (K) |
| Comparative Example 6 | Comparative Example 5 | 100.0 | 5000 |
| Example 7 | Example 6 | 100.5 | |

The relative luminous flux of the light emitting device in Example 7, at which the correlated color temperature was 5,000 K, was higher than that of the light emitting device in Comparative Example 6.

Example 8

Using the chlorosilicate fluorescent material in Example 3 as a fluorescent material core, a chlorosilicate fluorescent material powder in Example 8, in which $SiO_2$ was adhered on the surface of the fluorescent material core, was obtained in the same manner as in Example 6 except that the amount of tetraethoxysilane ($Si(OC_2H_5)_4$) was changed to 6.8 g in terms of silica.

The particle diameter, the light emission peak wavelength ($\lambda$p (nm)), and the internal quantum efficiency (%) of the chlorosilicate fluorescent material in each of Examples 6 and 8 were measured in the same manner as described above. The results are shown in Table 6.

TABLE 6

| | Fluorescent Material (before $SiO_2$ adhesion) | Volume Median Diameter D50 (μm) | Light Emission Peak Wavelength $\lambda$p (nm) | Internal Quantum Efficiency (%) |
| --- | --- | --- | --- | --- |
| Example 6 | Example 3 | 22.2 | 516 | 93.4 |
| Example 8 | | 12.6 | 514 | 93.6 |

The light emission peak wavelength and the internal quantum efficiency of the chlorosilicate fluorescent material in Example 8, in which $SiO_2$ was adhered on the surface, were substantially the same as those of the chlorosilicate fluorescent material in Example 6. On the other hand, the volume median diameter of the chlorosilicate fluorescent material in Example 8 was smaller than that of the chlorosilicate fluorescent material in Example 6.

Light Emitting Device

Example 9

A light emitting device was produced in the same manner as in Example 7 except that the chlorosilicate fluorescent material in Example 8 was used as a first fluorescent material.

Relative Luminous Flux

Using a total luminous flux measuring apparatus with an integrating sphere, the luminous flux of the light emitting device in Example 9 was measured. The relative luminous flux of the light emitting device in Example 9 was calculated when the luminous flux of the light emitting device in Comparative Example 6 was set as 100%. The results are shown in Table 7 together with the results of the light emitting device in Example 7.

TABLE 7

| | Fluorescent Material after SiO$_2$ adhesion) | Light Emitting Device | |
|---|---|---|---|
| | | Relative Luminous Flux (%) | Color Temperature (K) |
| Example 7 | Example 6 | 100.5 | 5000 |
| Example 9 | Example 8 | 101.2 | |

The relative luminous flux of the light emitting device in Example 9, at which the correlated color temperature was 5,000 K, was higher than that of the light emitting device in Example 7. The particle diameter of the chlorosilicate fluorescent material in Example 8 used in the light emitting device in Example 9 was smaller than that of the chlorosilicate fluorescent material in Example 6 used in the light emitting device in Example 7. Thus, it is presumed that, in the light emitting device in Example 9, a large amount of the chlorosilicate fluorescent material was unevenly distributed the upper side of the potted resin composition, that is, on the light emission side in the fluorescent member. It is also presumed that, when a large amount of the chlorosilicate fluorescent material was unevenly distributed the light emission side in the fluorescent member of the light emitting device, the light of which the wavelength was converted by the chlorosilicate fluorescent material was hardly absorbed into the second fluorescent material and the third fluorescent material. Accordingly, the relative luminous flux of the light emitting device in Example 9 was higher than that of the light emitting device in Example 7.

The chlorosilicate fluorescent material according to the present disclosure can be utilized in a light emitting device. The light emitting device according to the present disclosure can be suitably utilized as a light source for lighting system. In particular, the light emitting device can be suitably utilized in light sources using a light emitting diode as an excitation light source, such as light sources for lighting systems, LED displays, backlight sources for liquid crystals, traffic lights, lighting switches, various sensors, various indicators, and small-size strobes.

What is claimed is:

1. A method for producing a fluorescent material, comprising:
providing a compound containing Ca, a compound containing Eu, a compound containing Mg, a compound containing Si, and a compound containing Cl such that a molar ratio of Ca is in a range of 7 or more and 8.2 or less, a molar ratio of Eu is in a range of 0.01 or more and 1.1 or less, a molar ratio of Mg is in a range of 0.9 or more and 1.1 or less, a total molar ratio of Ca and Eu is in a range of 8.05 or more and 8.25 or less, and a molar ratio of Cl is in a range of 2.0 or more and 3.0 or less when a molar ratio of Si in the compound containing Si is set as 4;
mixing each of the compound containing Ca, the compound containing Eu, the compound containing Mg, the compound containing Si, and the compound containing Cl to obtain a raw material mixture; and
calcining the raw material mixture to obtain a chlorosilicate fluorescent material,
wherein at least one of the compound containing Eu, the compound containing Mg, and the compound containing Si is an oxide, and the compound containing Cl optionally contains Ca or Mg,
wherein the chlorosilicate fluorescent material comprises a chlorosilicate fluorescent material core, and
wherein a volume median diameter of the chlorosilicate fluorescent material core is in a range of 11.2 µm or more and 12.2 µm or less, and
adhering on the chlorosilicate fluorescent material core at least one oxide selected from the group consisting of Al$_2$O$_3$, SiO$_2$, ZrO$_2$, and TiO$_2$,
wherein the amount of the at least one oxide adhered on the surface of the chlorosilicate fluorescent material core is in a range of 2 parts by mass or more and 10 parts by mass or less relative to 100 parts by mass of the chlorosilicate fluorescent material core in terms of metal contained in the oxide.

2. The method for producing a fluorescent material according to claim 1, wherein the chlorosilicate fluorescent material has a chemical composition represented by the following formula (I):

$$Ca_xEu_yMg_zSi_4O_aCl_b \quad (I)$$

wherein a, b, x, y, and z each satisfy 7.0≤x≤7.94, 0.01≤y≤1.0, 7.76≤x+y≤7.90, 0.9≤z≤1.1, 15.6≤a≤16.1, and 1.90<b≤2.00.

3. The method for producing a fluorescent material according to claim 1, wherein a temperature for calcining the raw material mixture is in a range of 1,000° C. or more and 1,300° C. or less.

4. The method for producing a fluorescent material according to claim 1, wherein an atmosphere for calcining the raw material mixture is a reducing atmosphere.

5. The method for producing a fluorescent material according to claim 1, wherein an internal quantum efficiency of the fluorescent material is 87.0% or more.

6. The method for producing a fluorescent material according to claim 1, wherein an internal quantum efficiency of the fluorescent material is 87.0% or more and 93.4% or less.

* * * * *